United States Patent
Sakai et al.

(10) Patent No.: US 6,856,166 B2
(45) Date of Patent: Feb. 15, 2005

(54) STATUS SCHEME SIGNAL PROCESSING CIRCUIT

(75) Inventors: Kenji Sakai, Fukuoka (JP); Yoshikazu Tanaka, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 21 days.

(21) Appl. No.: 10/388,497

(22) Filed: Mar. 17, 2003

(65) Prior Publication Data

US 2004/0061529 A1 Apr. 1, 2004

(30) Foreign Application Priority Data

Sep. 30, 2002 (JP) ..................................... P2002-286063

(51) Int. Cl.[7] .......................... G06F 7/38; H03K 19/173; H03K 19/00
(52) U.S. Cl. ........................................ 326/38; 326/93
(58) Field of Search ..................... 326/38, 93; 327/156, 327/262; 329/319; 342/93; 345/29; 369/44.34; 381/73.1; 348/138; 365/189.01

(56) References Cited

U.S. PATENT DOCUMENTS

| | | | | |
|---|---|---|---|---|
| 3,578,904 A | * | 5/1971 | Dewey et al. | 348/138 |
| 3,579,249 A | * | 5/1971 | Dewey et al. | 348/138 |
| 3,838,422 A | * | 9/1974 | MacArthur et al. | 342/93 |
| 4,433,300 A | * | 2/1984 | Ingle | 329/319 |
| 4,477,803 A | * | 10/1984 | Conrad | 345/29 |
| 4,686,693 A | * | 8/1987 | Ritter | 381/73.1 |
| 5,757,216 A | * | 5/1998 | Murata | 327/156 |
| 5,923,197 A | * | 7/1999 | Arkin | 327/262 |
| 6,137,755 A | * | 10/2000 | Bakx et al. | 369/44.34 |
| 6,400,613 B1 | * | 6/2002 | Morgan | 365/189.01 |

* cited by examiner

*Primary Examiner*—Patrick Wamsley
(74) *Attorney, Agent, or Firm*—Oblon, Spivak, McClelland, Maier & Neustadt, P.C.

(57) ABSTRACT

In a status scheme signal processing circuit which obtains a desired output signal on the basis of an OR signal between a pulse output from a one-shot pulse circuit at an edge of an input signal and a status signal, since the input signal and the status signal are not synchronized with each other, the output timing of the output signal changes depending on the timing of the input signal. Therefore, in the present invention, a mask signal generator which outputs a mask signal having a predetermined bandwidth T1 in response to a signal leading edge and a signal trailing edge of the input signal, and said desired output signal is masked (disabled) with the mask signal, so that an output signal is always obtained a predetermined period (T1) after the input timing of the input signal.

8 Claims, 6 Drawing Sheets

STATUS SCHEME SIGNAL PROCESSING CIRCUIT

BACKGROUND OF THE INVENTION

1. Field of the Invention

The present invention relates to a signal processing circuit which outputs a signal corresponding to an input signal and, more particularly, to a signal processing circuit using a status scheme.

2. Description of the Related Arts

In order to obtain an output signal having a waveform corresponding to an input signal, a signal processing circuit using a status scheme is used. A desired output signal is obtained on the basis of an OR signal between an ON signal and an OFF signal output from a one-shot pulse circuit at a leading edge and a trailing edge of an input signal and a status signal which is a pulse signal having a predetermined cycle.

In such a circuit, since the input timing of the input signal is not synchronized with the status signal, the output timing of the output signal varies depending on the phase of a status signal obtained when an input signal is received by the circuit. In the circuit which operates by receiving the output signal, the variation in output timing causes jitter generated by phase shift of the signal.

SUMMARY OF THE INVENTION

The present invention provides a status scheme signal processing circuit which outputs an output signal by using a mask signal output in synchronism with an input signal at a predetermined timing after the input signal.

In a status scheme signal processing circuit which obtains a desired output signal on the basis of an OR signal between an ON signal and an OFF signal output from a one-shot pulse circuit at a signal leading edge and a signal trailing edge of an input signal and a status signal serving as a pulse signal having a predetermined cycle, as has been described above, the output timing of the output signal varies depending on a phase of the status signal obtained when the input signal changes.

In the present invention, the status scheme signal processing circuit includes a mask signal generator for outputting a mask signal having a predetermined bandwidth T1 in response to a signal leading edge and a signal trailing edge of an input signal, and using a masking means, said desired output signal is disabled by the mask signal. More specifically, while the mask signal is output, said desired output signal is disabled. In this manner, at the end of the mask signal, said desired output signal is enabled, and said desired output signal is actualy output at this time (i.e., T1 after the change of the input signal).

DESCRIPTION OF THE PREFERRED EMBODIMENTS

First Embodiment

Figure 1:
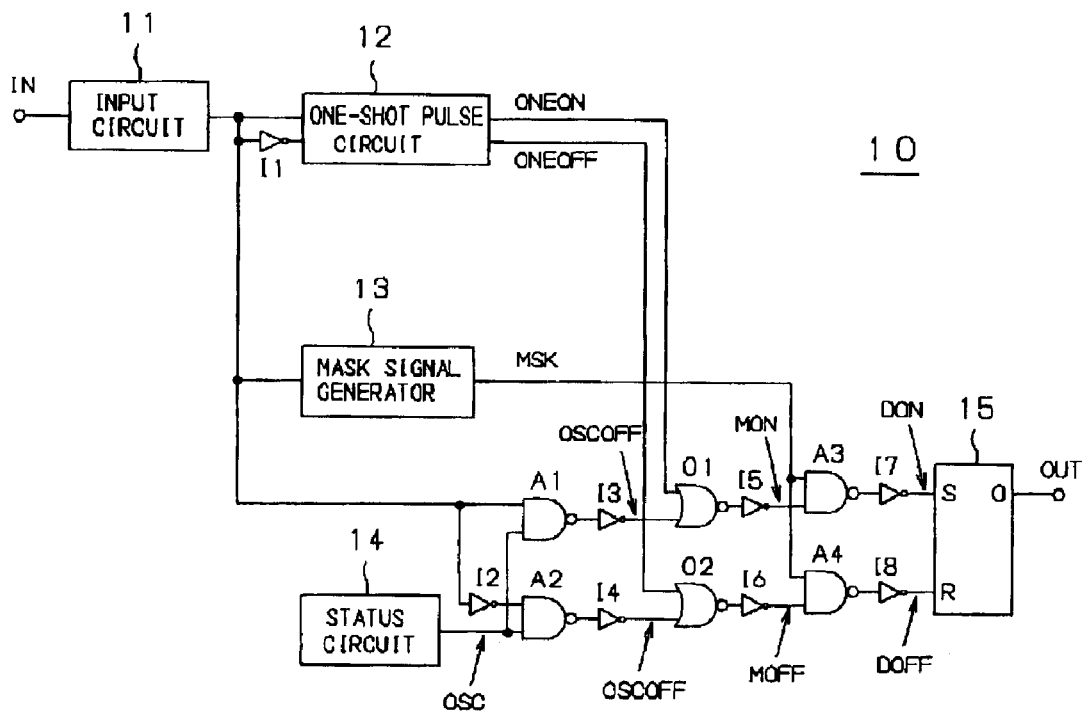
FIG. 1 is a circuit diagram of a status scheme signal processing circuit according to the first embodiment of the present invention.

FIG. 1 shows a status scheme signal processing circuit 10 which represents the first embodiment of the present invention. A signal IN input to an input circuit 11 is input to a one-shot pulse circuit 12 together with a signal inverted by an inverter I1. Signals ONEON and ONEOFF corresponding to the respective signals are output from the one-shot pulse circuit 12. The input signal IN is input to a mask signal generator 13 and a NAND circuit A1. The input signal IN is inverted by an inverter I2, and the inverted signal is input to an NAND circuit A2.

A status signal OSC from the status circuit 14 is input to other input sections of the NAND circuits A1 and A2. Outputs from the NAND circuits A1 and A2 are input to one inputs sections of NOR circuits O1 and O2 through inverters I3 and I4, and the signals ONEON and ONEOFF are input to the other input sections, respectively.

Outputs from the NOR circuits O1 and O2 are input to one input sections of NAND circuits A3 and A4 which acts as a masking means through inverters I5 and I6, respectively, and a mask signal MSK from a mask signal generator 13 is input to the other input units. Outputs from the NAND circuits A3 and A4 are input to an S terminal and an R terminal of a flipflop circuit 15 through inverters I7 and I8, respectively, and a desired signal OUT is output from an O terminal.

Figure 2:
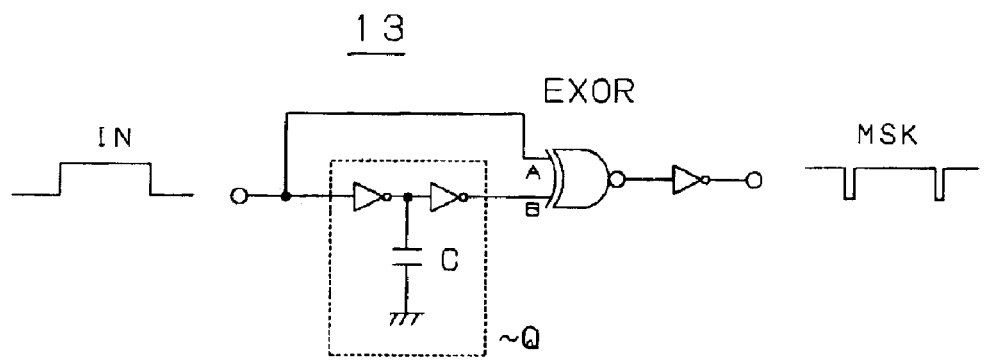
FIG. 2 is a circuit diagram showing the details of a mask signal generator in FIG. 1.

FIG. 2 shows a circuit configuration of the mask signal generator 13. An input signal IN is directly applied to an input section A of an EXOR, and is input to the other input section B through a delay circuit Q constituted by two inverters and a capacitor C. In this manner, when the input signal N changes its level, delay instantaneously occurs at the input section B, and input levels to both the input sections of the EXOR are different form each other. For this reason, a pulse is output from the EXOR. Since this circuit has a simple configuration, the circuit can be mad compact.

Figure 3:
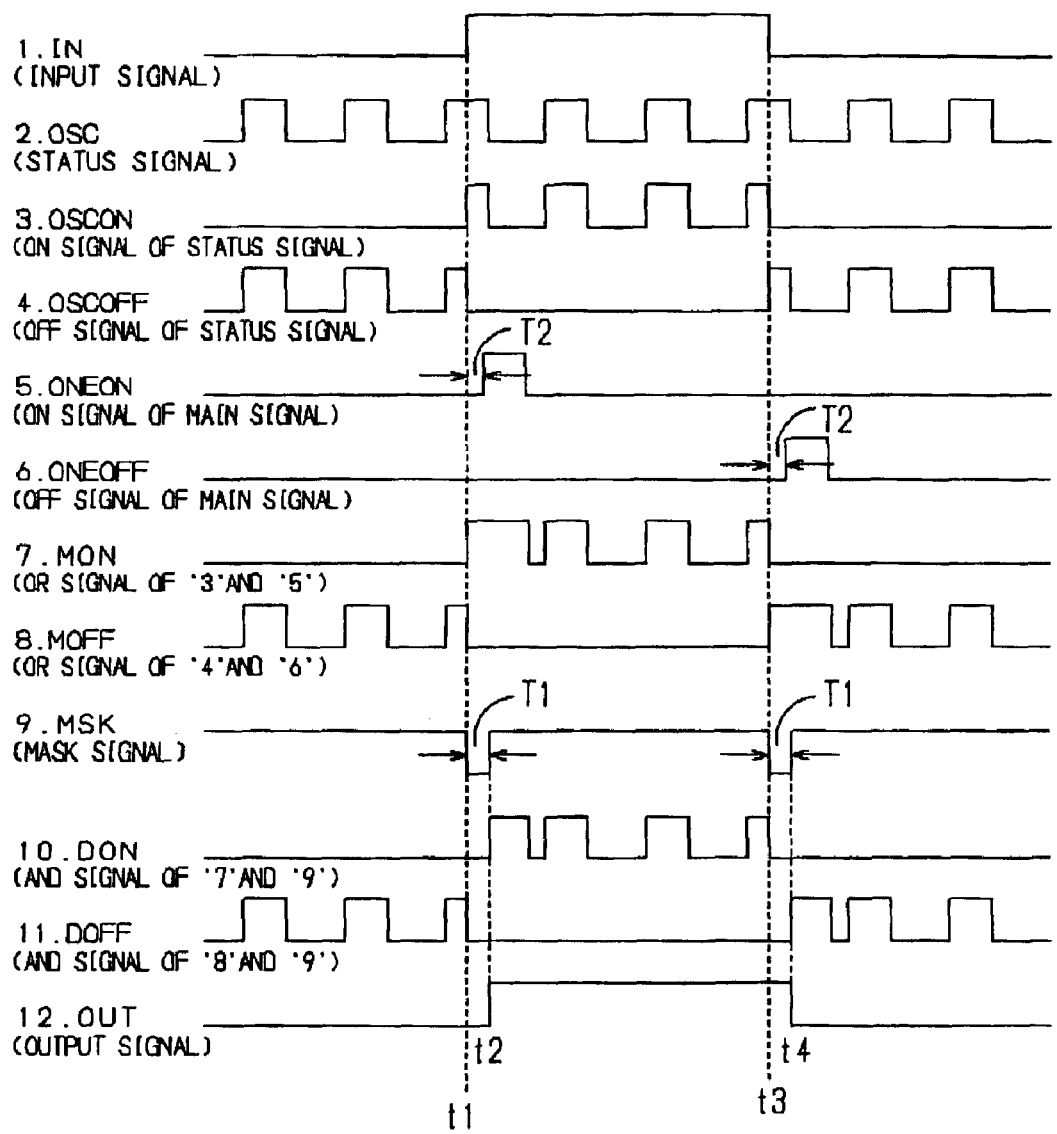
FIG. 3 is a time chart showing an operation of the circuit in FIG. 1.

FIG. 3 is a time chart showing an operation of the status scheme signal processing circuit 10. An OSCON signal and an OSCOFF signal are status signals which are output only while the input signal IN is set at a high level and at a low level. An MON signal is an OR signal between the OSCON signal and the ONEON signal, and an MOFF signal is an OR signal between OSCOFF signal and the ONEOFF signal.

A DON signal is an AND signal between the MON signal and the mask signal MSK, and a DOFF signal is an AND signal between the MOFF signal and the mask signal MSK. The mask signal MSK is a signal which is set at a low level periods T1 after points of time t1 and t3 of the signal leading edge and the signal trailing edge of the input signal IN. Therefore, the DON signal always goes to a low level in a period T1 after the point of time t1. The DOFF signal always goes to a low level in a period T1 after the point of time t3.

As a result, the output signal OUT changes from low level to high level at a point of time t2 the period T1 after the point of time t1, and changes from high level to low level at a point of time t4 the period T1 after the point of time t3.

Figure 4:
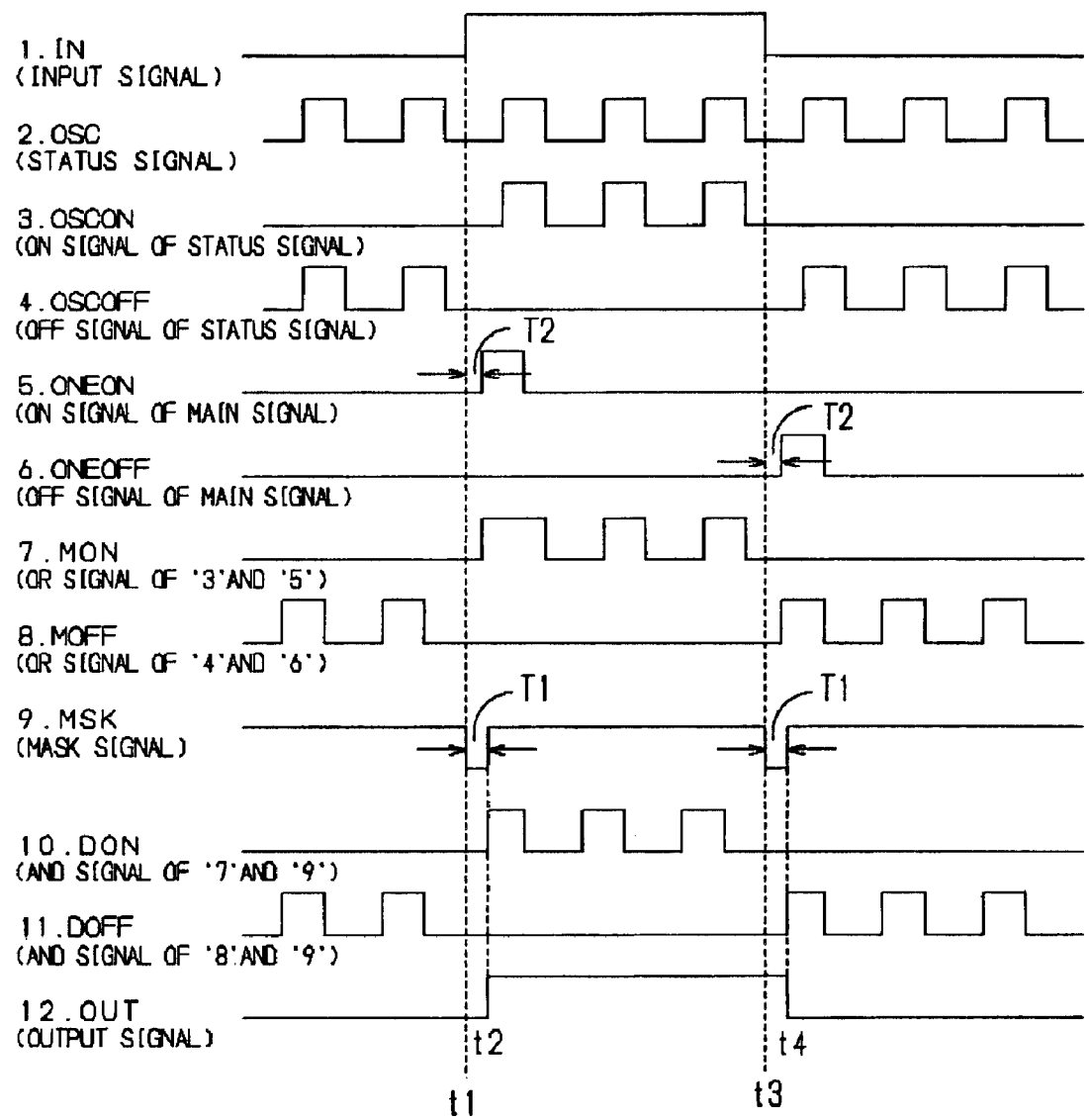
FIG. 4 is a time chart showing an operation of the circuit in FIG. 1.

In FIG. 3, the signal leading edge (t1) and the signal trailing edge (t3) of the signal IN are generated while the status signal OSC is set at a high level. As shown in FIG. 4, a case in which the leading edge t1 and the trailing edge t3 are generated when the status signal OSC is set at a low level.

In this case, immediately after the point of time t1, although the OSCON signal is set at a low level, the ONEON signal goes to a high level at least a period T2 (response time of the one-shot pulse circuit 12) after. For this reason, the MON signal also goes to a high level after period T2 from the point of time t1. The mask signal MSK is applied as the MON signal. At this time, when the period T1 is made longer than the period T2, the DON signal always goes to a high level at the point of time t2, and the output signal OUT goes to a high level at the point of time t2.

When the input signal IN changes from a high level to a low level, as in the operation at the period of time t1, the output signal OUT changes from a high level to a low level at the point of time t4, which is after period T1 from the point of time t3. In this manner, when the input signal IN changes from a low level to a high level at the point of time t1, the output signal OUT changes from a low level to a high level at the point of time t2, which is after period T1 from the point of time t1 regardless of the level of the status signal OSC. When the input signal IN changes from a high level to a low level at the point of time t3, the output signal OUT always changes from a low level to a high level at the point of time t4, which is after period T1 from the point of time t3.

Second Embodiment

Figure 5:
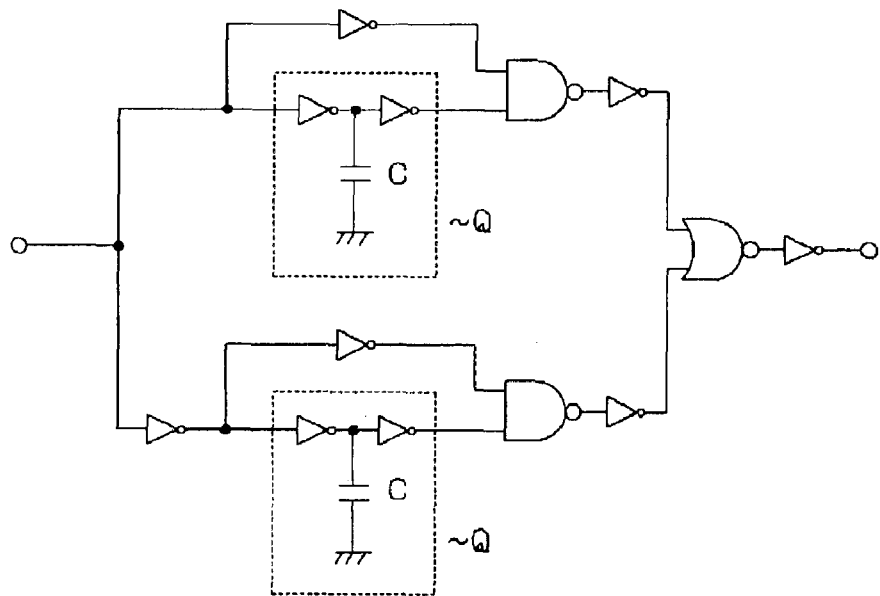
FIG. 5 is a circuit diagram of a mask signal generrator in FIG. 1 according to another embodiment.

FIG. 5 shows another circuit configuration of the mask signal generator 13. This circuit is obtained by adding a delay circuit Q to the same circuit as that of the one-shot pulse circuit 12. According to this circuit, when an input signal changes to a high level, the upper half of the circuit outputs a pulse (corresponding to ONEON in FIG. 1). When the input signal changes to a low level, the lower half of the circuit outputs a pulse (corresponding to ONEOFF in FIG. 1). In this manner, since pulses are output from the independent circuits, the bandwidths of both the pulses can be made equal to each other. Since this circuit has the same circuit configuration as that of the one-shot pulse circuit 12, relative accuracy can be made high.

Third Embodiment

Figure 6:
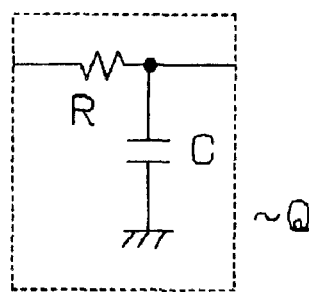
FIG. 6 is a circuit diagram of the first configuration of a delay circuit in the mask signal generator.

The delay circuit Q indicated by broken lines in FIGS. 2 and 5 is constituted by two inverters and one capacitor. However, the delay circuit Q is not limited to this configuration, and various circuit can be employed as the delay circuit Q. As the delay circuit Q, in FIG. 6, a simple circuit constituted by a resistor R and a capacitor C is employed, and the entire circuit configuration can be simplified.

Fourth Embodiment

Figure 7:
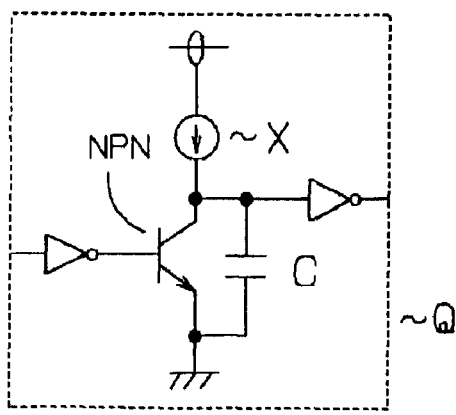
FIG. 7 is a circuit diagram of the second configuration of the delay circuit in the mask signal generator.

As a delay circuit Q, in FIG. 7, an NPN transistor NPN and a constant current source X are connected in series with each other, and the capacitor C is connected between the collector and the emitter of the NPN transistor NPN. In this circuit, dependence on a power supply voltage can be decreased.

Fifth Embodiment

Figure 8:
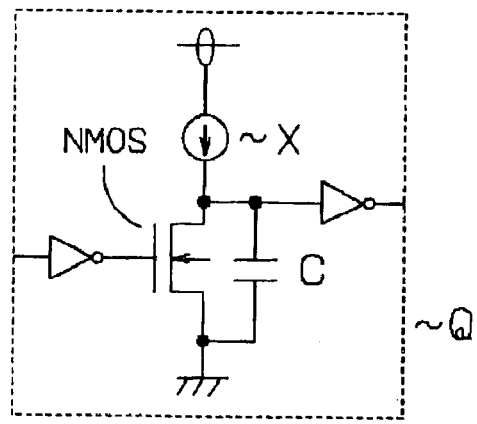
FIG. 8 is a circuit diagram of the third configuration of the delay circuit in the mask signal generator.

As a delay circuit Q, in FIG. 8, an NMOS transistor NMOS is used in place of the NPN transistor NPN in FIG. 7. In this circuit, a pattern area can be made smaller than that in FIG. 7, and a high response speed can also be achieved.

Sixth Embodiment

Figure 9:
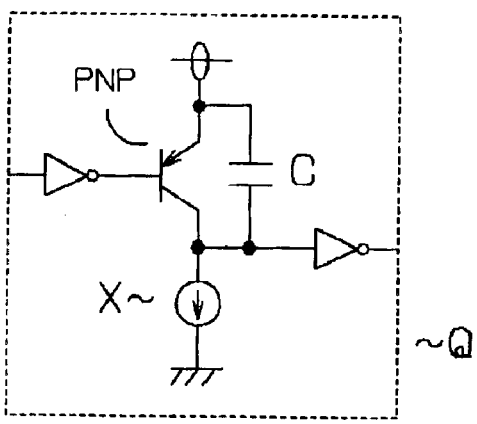
FIG. 9 is a circuit diagram of the fourth configuration of the delay circuit in the mask signal generator.

As a delay circuit Q, in FIG. 9, a PNP transistor PNP and a constant current source X are connected in series with each other, and a capacitor C is connected between the collector and the emitter of the transistor. This circuit is used when one terminal of the capacitor C cannot be connected to the ground.

Seventh Embodiment

Figure 10:
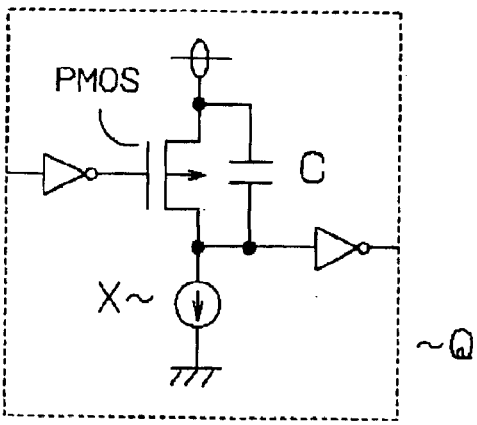
FIG. 10 is a circuit diagram of the fifth configuration of the delay circuit in the mask signal generator.

As a delay circuit Q, in FIG. 10, a PMOS transistor PMOS is used in place of the PNP transistor in FIG. 9. In this circuit, a pattern area can be made smaller than that in FIG. 9, and a high response speed can also be achieved.

Eighth Embodiment

Figure 11:
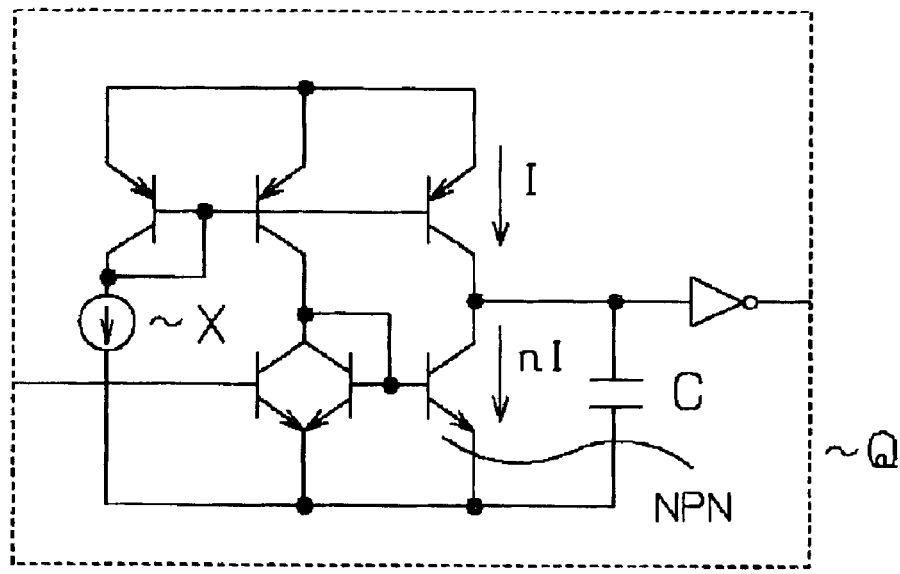
FIG. 11 is a circuit diagram of the sixth configuration of the delay circuit in the mask signal generator.

As a delay circuit Q, in FIG. 11, a combination of an NPN transistor NPN and a capacitor C is used as in FIG. 7. However, in place of the constant current source, a constant current circuit constituted by a constant current source and a current mirror circuit is used. According to this circuit, since a current can be easily changed, a pulse duty can be easily controlled.

Ninth Embodiment

Figure 12:
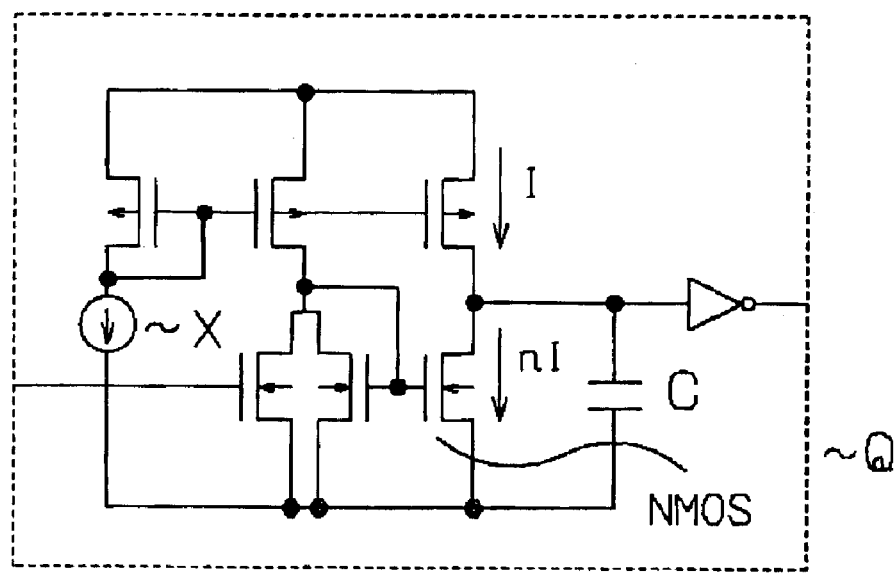
FIG. 12 is a circuit diagram of the seventh configuration of the delay circuit in the mask signal generator.

As a delay circuit Q, in FIG. 12, an NMOS transistor NMOS is used in place of the NPN transistor in FIG. 11. In this circuit, a pattern area can be made smaller than that in FIG. 11, and a high response speed can also be achieved.

A signal processing circuit using a status scheme which obtains a desired output signal on the basis of an OR signal between a pulse output from a one-shot pulse circuit at an edge of an input signal and a status signal includes a mask signal generator which outputs a mask signal having a predetermined bandwidth in response to an edge of the input signal, and said desired output signal is masked with the mask signal For this reason, an output signal can be always obtained a predetermined period after an input timing of the input signal.

What is claimed is:

1. A status scheme signal processing circuit, comprising:
an input circuit configured to receive an input signal IN;
a one-shot pulse circuit connected to an output of the input circuit and configured to generate a one-shot pulse ONEON representing ON of the input signal IN during a first period of time after a leading edge of the input signal IN, said one-shot pulse circuit further configured to generate a one-shot pulse ONEOFF representing OFF of the input signal IN during a first period of time after a trailing edge of the input signal IN;
a status signal-generating circuit configured to generate a status signal OSC;
a status signal conversion circuit configured to output said status signal OSC as a status-on signal OSCON while said input signal IN has a high level, said status signal conversion circuit further configured to output said status signal OSC as a status-off signal OSCOFF while said input signal IN has a low level;
a mask signal-generating circuit connected to another output of the input circuit and configured to generate a mask signal MSK during a second period of time after the leading edge of said input signal IN, and after a second period of time after the trailing edge of said input signal IN;
a first circuit configured to generate an OR signal (MON) of said one-shot pulse signal ONEON and said status-on signal OSCON;

a second circuit configured to generate an OR signal (MOFF) of said one-shot pulse signal ONEOFF and said status-off signal OSCOFF;

a third circuit configured to generate an AND signal (DON) of said OR signal MON and said mask signal MSK;

a fourth circuit configured to generate an AND signal (DOFF) of said signal MOFF and said mask signal MSK; and a flip-flop circuit configured to receive said signal DON as a set signal, and said signal DOFF, as a reset signal.

2. The status scheme signal processing circuit according to claim 1, wherein said mask signal generator comprises an EXOR and a delay circuit.

3. The status scheme signal processing circuit according to claim 2, wherein said delay circuit comprises:

a resistor, and a capacitor.

4. The status scheme signal processing circuit according to claim 2, wherein said delay circuit comprises:

a constant current source, an NPN transistor or a PNP transistor connected in series with the constant current source, and a capacitor connected between the collector and the emitter of the transistor.

5. The status scheme signal processing circuit according to claim 2, wherein said delay circuit comprises:

a constant current source, an MOS transistor connected in series with the constant current source, and a capacitor connected between the source and the drain of the transistor.

6. The status scheme signal processing circuit according to claim 2, wherein said delay circuit comprises:

an NPN transistor, a capacitor connected between the collector and the emitter of the transistor, and a constant current circuit including
  a constant current source, and
  a current mirror circuit.

7. The status scheme signal processing circuit according to claim 2, wherein said delay circuit comprises an NMOS transistor, a capacitor connected between the source and the drain of the transistor, and a constant current circuit constituted by a constant current source and a current mirror circuit.

8. The status scheme signal processing circuit according to claim 1, wherein said mask signal generator comprises:

a mask signal generator one-shot pulse circuit, and a delay circuit.

* * * * *